(12) United States Patent
Naijo

(10) Patent No.: US 9,231,221 B2
(45) Date of Patent: Jan. 5, 2016

(54) ORGANIC LIGHT EMITTING DIODE DISPLAY INCLUDING BENT FLEXIBLE SUBSTRATE AND METHOD OF FORMING THE SAME

(71) Applicant: Samsung Display Co., Ltd., Yongin-City, Gyeonggi-Do (KR)

(72) Inventor: Tsuyoshi Naijo, Gyeonggi-do (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/156,585

(22) Filed: Jan. 16, 2014

(65) Prior Publication Data
US 2015/0008396 A1   Jan. 8, 2015

(30) Foreign Application Priority Data

Jul. 5, 2013   (KR) .................. 10-2013-0079279

(51) Int. Cl.
*H01L 51/52* (2006.01)
*H01L 51/00* (2006.01)
*H01L 27/32* (2006.01)

(52) U.S. Cl.
CPC .......... *H01L 51/0097* (2013.01); *H01L 27/326* (2013.01); *H01L 27/3267* (2013.01); *H01L 27/3244* (2013.01); *H01L 51/5246* (2013.01); *H01L 51/5284* (2013.01); *H01L 2251/5338* (2013.01)

(58) Field of Classification Search
CPC ............ H01L 51/0097; H01L 27/3218; H01L 27/3267
USPC .................. 257/40; 438/28; 345/31.3, 156, 80
See application file for complete search history.

(56) References Cited

U.S. PATENT DOCUMENTS

| 7,787,097 B2 * | 8/2010 | Satoh ............................. 349/158 |
| 2004/0061136 A1 * | 4/2004 | Tyan et al. .................... 257/200 |
| 2005/0110403 A1 * | 5/2005 | Han et al. ...................... 313/512 |

(Continued)

FOREIGN PATENT DOCUMENTS

| EP | 1752818 A2 | 2/2007 |
| GB | 2134299 A | 8/1984 |

(Continued)

OTHER PUBLICATIONS

The Extended European Search Report for European Patent Appl. No. 14162412.2 dated Dec. 16, 2014.

*Primary Examiner* — Mamadou Diallo
*Assistant Examiner* — Christina Sylvia
(74) *Attorney, Agent, or Firm* — Cantor Colburn LLP

(57) ABSTRACT

An organic light emitting diode display includes: a flexible substrate configured to be bent at least once; a first display part on the flexible substrate and including a plurality of first light emitting elements; and a second display part on the flexible substrate and including a plurality of second light emitting elements. Each of a first light emitting element and a second light emitting element among the plurality of first and second light emitting elements includes a first electrode, an emission layer and a second electrode, the first electrode of the first light emitting element includes a transparent layer or a semi-transparent layer, the first electrode of the second light emitting element includes a reflective layer, and the second electrode of the first light emitting element and the second light emitting element, includes the transparent layer or the semi-transparent layer.

15 Claims, 10 Drawing Sheets

(56) References Cited

U.S. PATENT DOCUMENTS

| | | |
|---|---|---|
| 2006/0231842 A1 | 10/2006 | Hirakata et al. |
| 2007/0015006 A1* | 1/2007 | Lee et al. .................. 428/690 |
| 2008/0311361 A1* | 12/2008 | Lee et al. .................. 428/209 |
| 2010/0308335 A1* | 12/2010 | Kim et al. .................. 257/59 |
| 2011/0115693 A1 | 5/2011 | Kim |
| 2012/0049203 A1* | 3/2012 | Mondada et al. .......... 257/88 |
| 2014/0117844 A1 | 5/2014 | Naijo |
| 2014/0145161 A1 | 5/2014 | Naijo |

FOREIGN PATENT DOCUMENTS

| | | |
|---|---|---|
| KR | 1020010051880 A | 6/2001 |
| KR | 1020060122601 A | 11/2006 |
| KR | 1020070011011 A | 1/2007 |
| KR | 1020100092222 A | 8/2010 |

* cited by examiner ic light emitting diode display that emits light from the front side of the substrate, the light emitted from the front side of the substrate is reduced by the transparent layer or semi-transparent layer.

ORGANIC LIGHT EMITTING DIODE DISPLAY INCLUDING BENT FLEXIBLE SUBSTRATE AND METHOD OF FORMING THE SAME

This application claims priority to Korean Patent Application No. 10-2013-0079279 filed on Jul. 5, 2013, and all the benefits accruing therefrom under 35 U.S.C. §119, the entire contents of which are incorporated herein by reference.

BACKGROUND (a) Field

The invention relates to a flexible display device. More particularly, the invention relates to a flexible organic light emitting diode display including an organic light emitting element.

(b) Description of the Related Art

An organic light emitting diode display is a self-light emitting display that displays an image by using an organic light emitting diode that emits light. The organic light emitting diode display differs from a liquid crystal display as not including a separate light source, and having relatively small thickness and weight. Furthermore, as the organic light emitting diode display involves high quality characteristics such as low power consumption, high luminance and short response time, the organic light emitting diode display is spotlighted as a next generation display device for portable electronic appliances.

The organic light emitting element includes two electrodes and an emitting layer located therebetween, and excitons are generated by combining electrons provided from one of the two electrodes and holes provided from the other electrode at the emitting layer. Energy is output from the excitons when a ground state thereof is reached, to thereby emit light.

It is important for the organic light emitting element to have increased luminous efficiency and to simultaneously have an improved life-span.

To increase the life-span of the organic light emitting element, a structure of a plurality of deposited charge auxiliary layers such as an emission layer, a hole injection layer, and an electron injection layer to increase the magnitude of luminance for a current by two times or three times has been developed.

SUMMARY

Accordingly, one or more exemplary embodiment of the invention provides an organic light emitting diode display with increased luminance of an organic light emitting element without increasing a complexity and cost in a manufacturing process of forming an emission layer, an electron auxiliary layer and a hole auxiliary layer of the organic light emitting element.

An organic light emitting diode display according to the invention includes: a flexible substrate configured to be bent at least once; a first display part on the flexible substrate and including a plurality of first light emitting elements; and a second display part on the flexible substrate and including a plurality of second light emitting elements. Each of a first light emitting element and a second light emitting element among the plurality of first and second light emitting elements includes a first electrode, an emission layer and a second electrode, the first electrode of the first light emitting element includes a transparent layer or a semi-transparent layer, the first electrode of the second light emitting element includes a reflective layer, and the second electrode of the first light emitting element and the second light emitting element, includes the transparent layer or the semi-transparent layer.

The reflective layer may include at least one material among magnesium (Mg), silver (Ag), gold (Au), calcium (Ca), lithium (Li), chromium (Cr), and aluminum (Al), and alloys thereof, and the transparent layer may include one material among indium tin oxide ("ITO"), indium zinc oxide ("IZO"), zinc oxide ("ZnO"), or indium oxide (In2O3).

The flexible substrate includes a bending region between the first display part and the second display part, at which the flexible substrate is configured to be bent.

The organic light emitting diode display may further include a sealant an edge of the first display part. The first display part and the second display part may be sealed between the sealant and the flexible substrate in a bent state of the organic light emitting diode display.

The emission layer may emit white light.

The organic light emitting diode display may further include a third display part on the flexible substrate, between the first display part and the second display part in an unbent state of the organic light emitting diode display, and including a plurality of third light emitting elements.

A third light emitting element among the plurality of third light emitting elements may be on a same surface of the flexible substrate as the first light emitting element and the second light emitting element.

The third light emitting element may include the first electrode, the emission layer, and the second electrode, and the first electrode and the second electrode of the third light emitting element may include the transparent layer or the semi-transparent layer.

The emission layer of the third light emitting element may emit white light.

The reflective layer may include at least one material among magnesium (Mg), silver (Ag), gold (Au), calcium (Ca), lithium (Li), chromium (Cr), and aluminum (Al), and alloys thereof, and the transparent layer may include one material among ITO, IZO, ZnO, or In2O3.

The flexible substrate may include at least one of polyimide, polycarbonate, polyacrylate, polyetherimide, polyethersulfone, polyethylene terephthalate and polyethylene naphthalate.

In one or more exemplary embodiment of the organic light emitting diode display, a plurality of light emitting units is disposed within the organic light emitting diode display without multiple deposition processes. To achieve a multi-layer organic emission layer of light emitting elements of the organic light emitting diode display, multiple display parts each including a layer of light emitting elements is disposed on a flexible substrate, and the flexible substrate is bent to position the layers of light emitting elements to overlap each other and achieve the multi-layer organic emission layer of the organic light emitting diode display, such that the organic light emitting diode display with increased luminance of the organic light emitting elements is provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
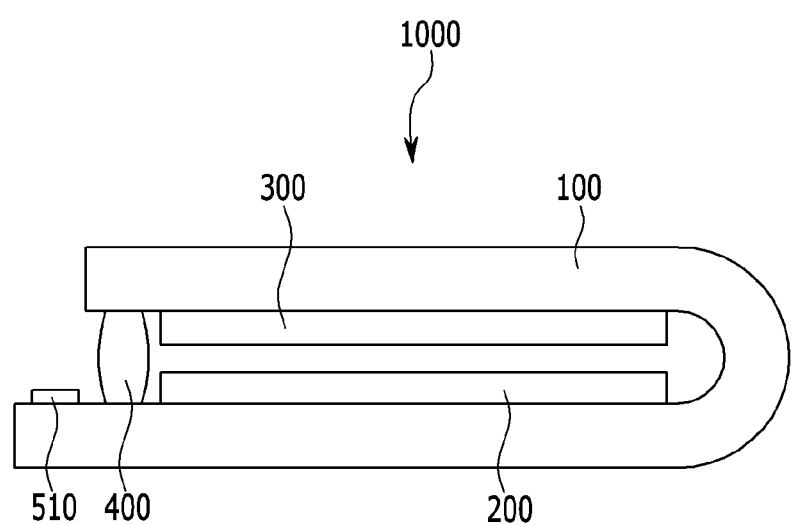
FIG. 1 is a schematic cross-sectional view of an exemplary embodiment of an organic light emitting diode display according to the invention.

To increase a life-span of an organic light emitting element included in an organic light emitting diode display, a structure of a plurality of deposited charge auxiliary layers such as an organic emission layer, a hole injection layer and an electron injection layer to increase the magnitude of luminance for an electrical current by two times or three times has been developed. However, to deposit a plurality of auxiliary layers of the organic emission layer, a unit of the hole auxiliary layer, the emission layer and the electron auxiliary layer must be repeatedly deposited such that a deposition process and a cost thereof are undesirably increased. Therefore, there remains a need for an improved organic light emitting diode display and organic light emitting element thereof, which simplifies a manufacturing process and a cost of manufacturing thereof.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "above" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Now, an organic light emitting diode display according to an exemplary embodiment will be described with reference to accompanying drawings.

Figure 2:
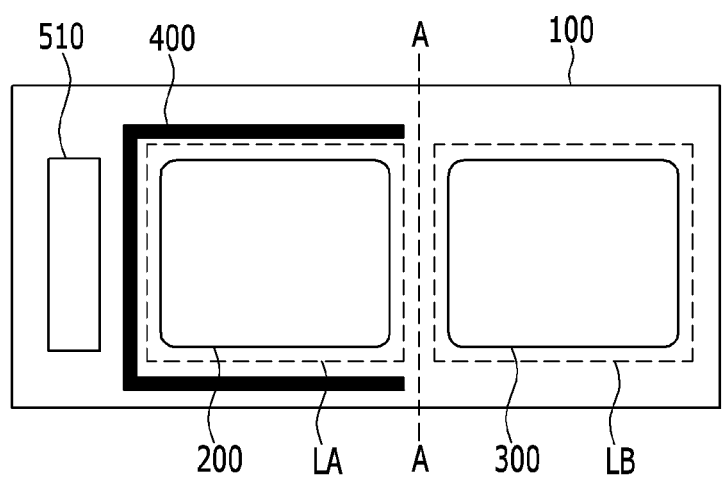
FIG. 2 is a schematic top plan view of the organic light emitting diode display of FIG. 1.
Figure 3:
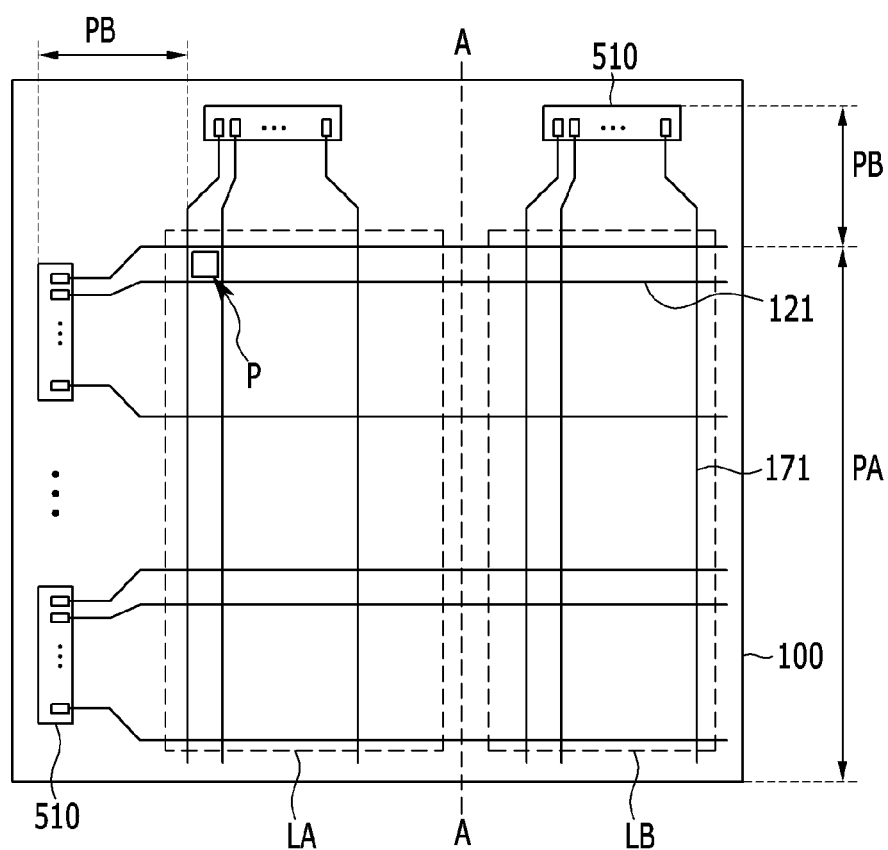
FIG. 3 is a plan view of an exemplary embodiment of a signal line of a display part of an organic light emitting diode display according to the invention.
Figure 4:
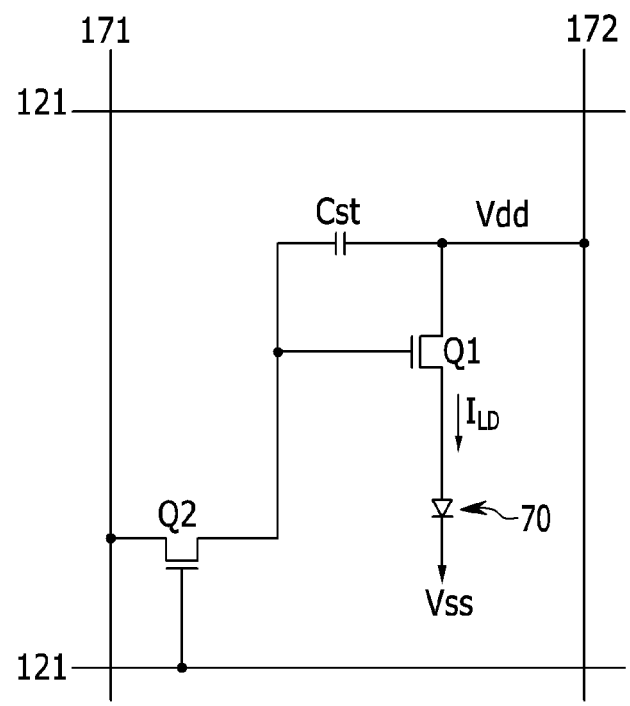
FIG. 4 is an equivalent circuit of an exemplary embodiment of one pixel of a display part of an organic light emitting diode display according to the invention.

FIG. 1 is a schematic cross-sectional view of an exemplary embodiment of an organic light emitting diode display according to the invention, FIG. 2 is a schematic top plan view of the organic light emitting diode display of FIG. 1, FIG. 3 is a plan view of an exemplary embodiment of a signal line of a display part of an organic light emitting diode display according to the invention, and FIG. 4 is an equivalent circuit of an exemplary embodiment of one pixel of a display part of an organic light emitting diode display according to the invention.

As shown in FIG. 1 and FIG. 2, an exemplary embodiment of a flexible display device 1000 according to the invention includes a substrate 100, and a first display part 200 and a second display part 300 including a plurality of pixels on the substrate 100. Each pixel of the first display part 200 includes a first light emitting element (not shown) and each pixel of the second display part 300 includes a second light emitting element (not shown).

The substrate 100 as a flexible substrate, may include an organic material selected from insulation organic materials, such as polyether sulphone ("PES"), polyacrylate, polyetherimide ("PEI"), polyethylene naphthalate ("PEN"), polyethylene terephthalate ("PET"), polyphenylene sulfide ("PPS"), polyallylate, polyimide, polycarbonate ("PC"), triacetyl cellulose ("TAC"), and cellulose acetate propionate ("CAP"). The substrate 100 may be a single, unitary, indivisible member which is configured to be bent at one or more locations thereof.

Referring to FIG. 2, the substrate 100 includes a first display area LA and a second display area LB. The first display part 200 is positioned at the first display area LA, and the second display part 300 is positioned at the second display area LB. The substrate 100 is configured to be bent such that the first display part 200 and the second display part 300 face each other in a folded state of the flexible display device 1000. FIG. 1 shows a folded state of the flexible display device 1000, and FIG. 2 and FIG. 3 show an unfolded state of the flexible display device 1000. The overall display area PA of the substrate 100 may collectively include portions of the first and second display areas LA and LB.

The pixels of the first display part 200 and the second display part 300 are respectively arranged in a matrix and connected to a plurality of signal lines.

Referring to FIG. 3, a first signal line 121 extending in a first direction and transmitting a scan signal, and a second signal line 171 crossing the first signal line 121 and transmitting a video signal, are on the first display area LA and the second display area LB of the substrate 100. The first signal line 121 and/or the second signal line 171 may be continuous to extend from the first display area LA and the second display area LB. The first signal line 121 and the second signal line 171 are each connected to a pixel, and the pixel may be connected to various signal lines (not shown) applying different signals thereto, as well as the first signal line 121 and the second signal line 171.

A driver 510 positioned at a peripheral area PB outside the first display area LA and the second display area LB and controlling the thin film transistor of the pixel, is positioned on the substrate 100. The flexible display device 1000 may include one or more driver 510 in the peripheral area PB.

The driver 510 as an integrated circuit ("IC") chip is mounted on the substrate 100, or may be integrated on the substrate 100 along with the thin film transistor of the first display area LA and the second display area LB. The first signal line 121 connected to the driver 510 is connected to and is positioned at the first display area LA and the second display area LB thereby intersecting a bending area A positioned between the first display area LA and the second display area LB.

The organic light emitting diode display of FIG. 1 to FIG. 3 may include a plurality of pixels respectively including an equivalent circuit as shown in FIG. 4.

Referring to FIG. 4, an exemplary embodiment of an organic light emitting diode display according to the invention includes a plurality of signal lines, and a plurality of pixels P connected thereto and arranged in an approximate matrix. A pixel P may be located between adjacent first and second signal lines 171 and 172, but the invention is not limited thereto.

The signal lines includes a plurality of first signal lines 121 transmitting a gate signal (or a scan signal), a plurality of second signal lines 171 transmitting a data signal, and a plurality of third signal lines 172 transmitting a driving voltage Vdd. The first signal lines 121 extend substantially in a row direction and are substantially parallel to each other, and the second signal lines 171 and the third signal lines 172 extend substantially in a column direction and are substantially parallel to each other thereby intersecting the first signal lines 121. The row direction may be a horizontal direction in FIG. 4 and the column direction may be a vertical direction in FIG. 4.

Each pixel P includes a switching thin film transistor Q2, a driving thin film transistor Q1, a storage capacitor Cst, and an organic light emitting diode 70.

The switching thin film transistor Q2 has a control terminal, an input terminal and an output terminal. The control terminal is connected to a first signal line 121, the input terminal is connected to a second signal line 171, and the output terminal is connected to the driving thin film transistor Q1. The switching thin film transistor Q2 transmits a data signal applied to the second signal line 171 to the driving thin film transistor Q1 in response to a scan signal applied to the first signal line 121.

The driving thin film transistor Q1 also includes a control terminal, an input terminal and an output terminal. The control terminal is connected to the switching thin film transistor Q2, the input terminal is connected to the third signal line 172, and the output terminal is connected to the organic light emitting diode 70. The driving thin film transistor Q1 enables output current $I_{LD}$, of which a magnitude is changed according to a voltage applied between the control terminal and the output terminal, to flow.

The capacitor Cst is connected between the control terminal and the input terminal of the driving thin film transistor Q1. The capacitor Cst charges a data signal applied to the control terminal of the driving thin film transistor Q1, and maintains the charged signal after the switching thin film transistor Q2 is turned off.

The organic light emitting diode 70 includes an anode connected to the output terminal of the driving thin film transistor Q1 and a cathode connected to a common voltage Vss. The organic light emitting diode 70 displays an image by emitting light while changing intensity of the light according to the output current $I_{LD}$ of the driving thin film transistor Q1.

Figure 5:
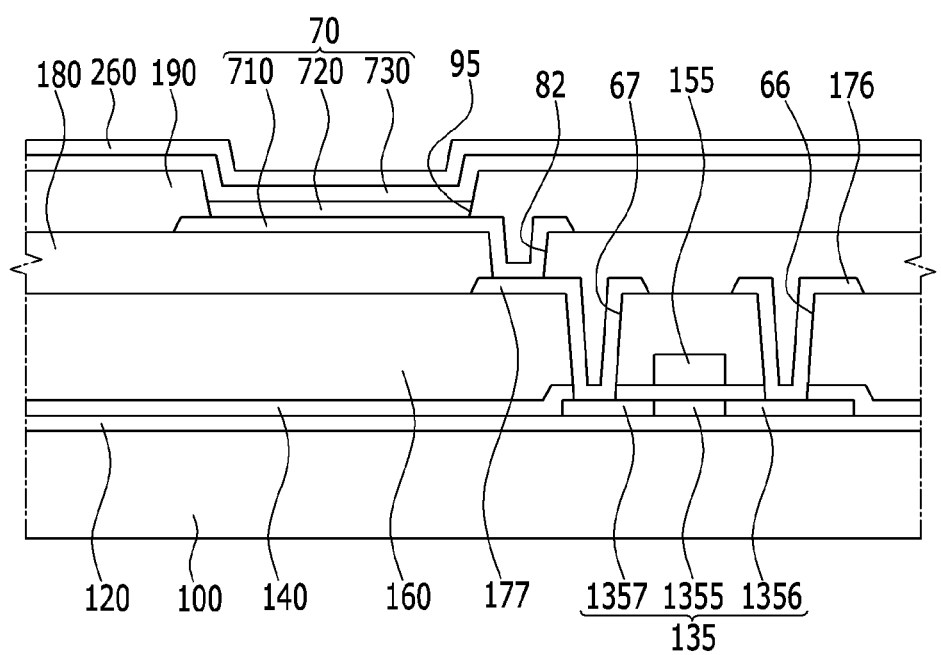
FIG. 5 is a cross-sectional view of an exemplary embodiment of the one pixel of the organic light emitting diode display of FIG. 4.

FIG. 5 is a cross-sectional view of an exemplary embodiment of the one pixel of the organic light emitting diode display of FIG. 4. The organic light emitting diode may otherwise be referred to as an organic light emitting element of the organic light emitting diode display.

FIG. 5 illustrates the pixel P according to a layer order focusing on the second thin film transistor Q2 and the organic light-emitting element 70 of FIG. 4. Hereinafter, the second thin film transistor Q2 will be referred to as a thin film transistor.

As shown in FIG. 5, an exemplary embodiment of the organic light emitting diode display includes a substrate 100, and a buffer layer 120 on the substrate 100.

The substrate 100 may be a transparent insulating substrate such as including glass, quartz, ceramic or plastic, or may be a conductive substrate such as including a metal like stainless steel.

The buffer layer 120 may be include a single layer structure (e.g., monolayer) such as including a SiNx layer, or a double layer structure such as including layers of SiNx and SiO2. The buffer layer 120 reduces or effectively prevents unnecessary elements such as impurities or moisture from infiltrating into the substrate 100, and planarizes the surface of the substrate 100.

A semiconductor layer 135 including polysilicon is on the buffer layer 120.

The semiconductor layer 135 is divided into a channel region 1355, and a source region 1356 and a drain region 1357 on opposing sides of the channel region 1355. In an exemplary embodiment, the channel region 1355 of the semiconductor layer 135 includes undoped polysilicon, that is, an intrinsic semiconductor. The source region 1356 and the drain region 1357 include polysilicon doped with a conductive impurity, that is, an impurity semiconductor. The impurity doped into the source region 1356 and the drain region 1357 may be a p-type impurity or an n-type impurity.

A gate insulating layer 140 is on the semiconductor layer 135. The gate insulating layer 140 may include a single layer structure or multi-layer structure including at least one of tetraethyl orthosilicate ("TEOS"), silicon nitride and silicon oxide.

A gate electrode 155 is on the semiconductor layer 135 and overlapping the channel region 1355 of the semiconductor layer 135.

The gate electrode 155 may include a single layer structure or multi-layer structure of a low resistance material or a highly corrosion-resistant material such as Al, Ti, Mo, Cu, Ni and alloys thereof.

A first interlayer insulating layer 160 is on the gate electrode 155. The first interlayer insulating layer 160 may include a single layer structure or multi-layer structure including at least one of TEOS, silicon nitride and silicon oxide, similar to the materials and structure of the gate insulating layer 140.

A source contact hole 66 and a drain contact hole 67 are defined in the first interlayer insulating layer 160 and the gate insulating layer 140, and respectively expose the source region 1356 and the drain region 1357 of the semiconductor layer 135.

A source electrode 176 and a drain electrode 177 are on the first interlayer insulating layer 160. The source electrode 176 is connected to the source region 1356 through the source contact hole 66, and the drain electrode 177 is connected to the drain region 1357 through the drain contact hole 67.

The source electrode 176 and the drain electrode 177 may include a single layer structure or multi-layer structure of a low resistance material or highly corrosion-resistant material such as Al, Ti, Mo, Cu, Ni and alloys thereof. In one exemplary embodiment, for example, the source electrode 176 and drain electrode 177 include three layers including Ti/Cu/Ti, Ti/Ag/Ti or Mo/Al/Mo.

The gate electrode 155, the source electrode 176 and the drain electrode 177 respectively correspond to the control terminal, the input terminal and the output terminal shown in FIG. 3, and form the thin film transistor (e.g., the second thin film transistor Q2) along with the semiconductor layer 135. A channel of the thin film transistor is defined by a portion of the semiconductor layer 135, which is disposed between the source electrode 176 and the drain electrode 177.

A second interlayer insulating layer 180 is on the source electrode 176 and the drain electrode 177. A contact hole 82 is defined in the second interlayer insulating layer 180 and exposes the drain electrode 177.

The second interlayer insulating layer 180 may include a single layer structure or multi-layer structure of at least one of TEOS, silicon nitride and silicon oxide, or may include a low dielectric constant organic material, similar to the material of the first interlayer insulating layer 160.

A first electrode 710 is on the second interlayer insulating layer 180. The first electrode 710 is electrically connected to the drain electrode 177 through the contact hole 82 and may be the anode of the organic light-emitting element of FIG. 2.

The second interlayer insulating layer 180 is between the first electrode 710 and the drain electrode 177 in the illustrated exemplary embodiment of the invention, but the invention is not limited thereto. In an alternative exemplary embodiment, the first electrode 710 may include a same material and be disposed at a same layer as those of the organic light emitting diode display as the drain electrode 177, and may be integrated with the drain electrode 177 (e.g., form a single, unitary indivisible electrode member).

A pixel definition layer 190 is on the first electrode 710.

An opening 95 is defined in and by portions of the pixel definition layer 190, and exposes the first electrode 710. The pixel definition layer 190 may include a resin such as a polyacrylate or polyimide, or an inorganic material such as silica.

An organic emission layer 720 is in the opening 95 of the pixel definition layer 190.

The organic emission layer 720 may include a multi-layer structure such as including an emission layer, and one or more of a hole injection layer, a hole transport layer, an electron transport layer, and an electron injection layer.

When the organic emission layer 720 includes all of the above-described layers, the hole injection layer may be disposed on and closes to the first electrode 710 corresponding to the anode, and the hole transport layer, emission layer, electron transport layer and electron injection layer may be sequentially on the hole injection layer. However, the invention is not limited thereto or thereby.

The emission layer of the organic light emitting diode OLED may include low polymer organic material or a high polymer organic material such as poly(3,4-ethylenedioxythiophene) ("PEDOT"). The emission layer may collectively include different color portions emitting respective color lights, such as a red emission layer portion that emits a red color, a green emission layer portion that emits a green color, and a blue emission layer portion that emits a blue color. The red emission layer portion, the green emission layer portion and the blue emission layer portion are disposed at a red pixel, a green pixel and a blue pixel of the organic light emitting diode display, respectively, to collectively embody a color image.

Further, the emission layer including the red emission layer portion, the green emission layer portion, and the blue emission layer portion respectively stacked at a red pixel, a green pixel and a blue pixel forms a red color filter, a green color filter and a blue color filter on a pixel basis, thereby embodying a color image. In another exemplary embodiment, by forming a white emission layer portion that emits white light at all of the red pixel, the green pixel and the blue pixel in addition to the red color filter, the green color filter, and the blue color filter on a pixel basis, a color image may be embodied. When a color image is embodied using a white emission layer portion and a color filter portion, a deposition mask for depositing a red emission layer portion, a green emission layer portion and a blue emission layer portion at respective individual pixels, e.g., a red pixel, a green pixel, and a blue pixel, may not be used in a method of manufacturing the organic light emitting diode display.

The white emission layer portion of another exemplary may be structured in one collective emission layer portion, and include a configuration that emits white light by stacking a plurality of emission layers portions. In one exemplary embodiment, for example, a collective white emission layer portion may include a configuration that emits white light by combining at least one yellow emission layer portion and at least one blue emission layer portion, a configuration that emits white light by combining at least one cyan emission layer portion and at least one red emission layer portion, and a configuration that emits white light by combining at least one magenta emission layer portion and at least one green emission layer portion.

A second electrode 730 is on the pixel definition layer 190 and the organic emission layer 720.

The second electrode 730 becomes a cathode of the organic light emitting element 70. Accordingly, the first electrode 710, the organic emission layer 720 and the second electrode 730 form the organic light emitting element 70.

The organic light emitting element 70 can be of one of a front display type, a rear display type, and a dual-sided display type according to the direction in which the organic light-emitting element 70 emits light.

In the front display type, the first electrode 710 includes a reflective layer and the second electrode 730 includes a transflective or transmissive layer. In the rear display type, the first electrode 710 includes a transflective layer and the second electrode 730 includes a reflective layer. In the dual-sided display type, the first electrode 710 and the second electrode 730 include a transparent layer or a semi-transparent layer.

The reflective layer and the semi-transparent layer include at least one of Mg, Ag, Au, Ca, Li, Cr, and Al, or an alloy thereof. The reflective layer and the transflective layer are determined by the thicknesses thereof, and the transflective layer may have a thickness of less than about 200 nanometers (nm). While the transmittance of the reflective layer or transflective layer increases as the thickness thereof decreases, the electrical resistance thereof increases when the layer is excessively thin.

The transmissive layer includes indium tin oxide ("ITO"), indium zinc oxide ("IZO"), zinc oxide ("ZnO"), or indium oxide (In2O3).

In an exemplary embodiment, the first display part 200 is the dual-sided display type, and the second display part 300 is the front display type.

That is, a first light emitting element 70 of the first display part 200 includes the first electrode 710 and the second electrode 730 including the transparent layer or the semi-transparent layer, and the second light emitting element 70 of the second display part 300 includes the first electrode 710 including the reflective layer and the second electrode 730 including the transparent layer or the semi-transparent layer.

An encapsulation member 260 is on the second electrode 730.

The encapsulation member 260 may include alternating an organic layer and an inorganic layer. The encapsulation member 260 may include a plurality of organic layers or a plurality of inorganic layers, respectively alternated with each other.

The organic layer includes a polymer, and may be a single layer structure or a deposition layer including one of polyethylene terephthalate, a polyimide, a polycarbonate, an epoxy, polyethylene and a polyacrylate. Further, the organic layer may include a polyacrylate, and in detail, may include a polymerized monomer composition including a di-acrylate monomer and tri-acrylate monomer. A mono-acrylate monomer can be included in the monomer composition. A photo-initiator such as monoacrylphosphine oxide ("TPO") can be further included in the monomer composition, but is not limited thereto.

The inorganic layer may include a single layer structure or a deposition layer including a metal oxide or a metal nitride. In detail, the inorganic layer may include one of SiNx, Al2O3, SiO2 and TiO2.

The externally exposed uppermost layer of the encapsulation layer 260 may include an inorganic layer so as to reduce or effectively prevent permeation of vapor into the organic light emitting element 70.

The encapsulation layer 260 may include a sandwich (e.g., layered) configuration in which at least one organic layer is inserted between at least two inorganic layers. Further, the encapsulation layer 260 can include a sandwich configuration in which at least one inorganic layer is included between at least two organic layers.

The encapsulation layer 260 can sequentially include a first inorganic layer, a first organic layer and a second inorganic layer in order from top to bottom of the respective display part. In addition, the encapsulation layer 260 can sequentially include a first inorganic layer, a first organic layer, a second inorganic layer, a second organic layer and a third inorganic layer in order from top to bottom of the respective display part. Further, the encapsulation layer 260 can sequentially include a first inorganic layer, a first organic layer, a second inorganic layer, a second organic layer, a third inorganic layer, a third organic layer and a fourth inorganic layer in order from top to bottom of the respective display part. However, the invention is not limited to the above-described layered configurations.

A metal halide layer including LiF can be included between the display part and the first inorganic layer of the encapsulation layer 260. The metal halide layer reduces or effectively prevents damage to the display unit during a method of manufacturing the organic light emitting diode display when the first inorganic layer is formed such as be using a sputtering method or a plasma deposition method.

The first organic layer of the encapsulation layer 260 is narrower than the second inorganic layer, and the second organic layer can be narrower than the third inorganic layer. Narrower may refer to a width of the layer taken parallel to the substrate 100. With this configuration, the first organic layer is entirely covered by the second inorganic layer, and the second organic layer can be entirely covered by the third inorganic layer. In one exemplary embodiment, upper and side surfaces of the organic layers may be overlapped by the respective wider inorganic layer.

Again referring to FIGS. 1 and 2, a sealant 400 is formed on the substrate 100, and combines the first display area LA and the second display area LB of the bent substrate 100 to be sealed.

The sealant 400 is positioned at the edge of the substrate 100 except for a bent portion A of the substrate 100, and is disposed according to a boundary line of the first display area LA or the second display area LB to enclose the first display area LA or the second display area LB.

The sealant 400 may include a thermal hardening or a photo-hardening adhesive, or may include a glass frit.

In this way, if the first display part 200 and the second display part 300 are provided, and the substrate 100 is bent such that first display part 200 and the second display part 300 face to each other with respect to the bending region A of the substrate 100, to form the organic light emitting diode display, luminance of the organic light emitting diode display may be increased.

The increase of the luminance of the organic light emitting diode display will be described with reference to FIG. 6.

Figure 6:
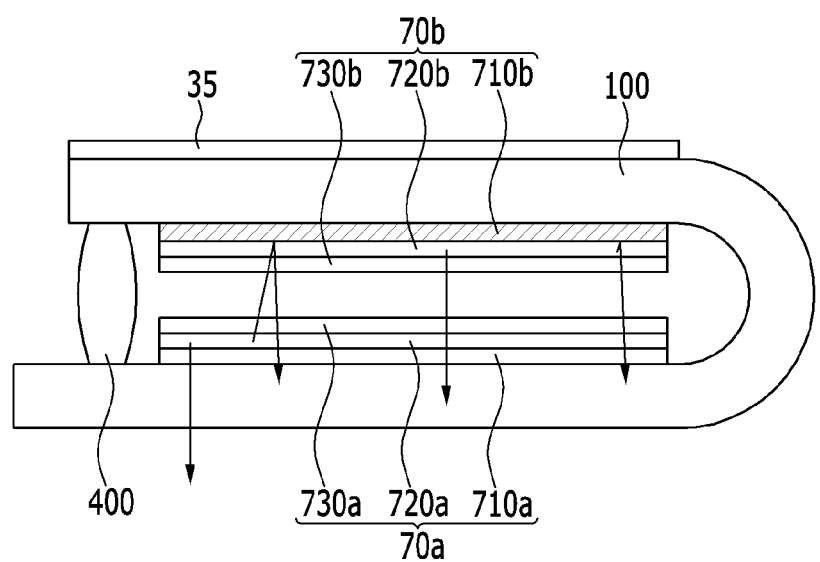
FIG. 6 is a schematic cross-sectional view of another exemplary embodiment of a light emitting element of an organic light emitting diode display according to the invention.

FIG. 6 is a schematic cross-sectional view of another exemplary embodiment of a light emitting element of an organic light emitting diode display according to the invention.

Referring to FIG. 1 and FIG. 6, if a driving signal is applied to the pixel of the first display part 200 and the second display part 300, an emission layer 720a of a first light emitting element 70a corresponding to the organic light emitting element of the first display 200 part emits light, and an emission layer 720b of a second light emitting element 70b corresponding to the organic light emitting element of the second display part 300 emits light.

In the second display part 300 including the front display type organic light emitting element, the first electrode 710b includes the reflective layer and the second electrode 730b includes the transparent layer. In the first display part 200 including the dual-sided display type organic light emitting element, the first electrode 710a and the second electrode 730a include the transparent layer.

The light emitted from the first display part 200 is emitted to the outside through the first electrode 710a. A first portion of the emitted light is transmitted in a direction of the first electrode 710a and is emitted to the outside, and a second portion thereof is transmitted in a direction of the second electrode 730a, is reflected by the first electrode 710b including the reflective layer of the second display part 200 and may be emitted to the outside through the first display part 200.

On the portion of the substrate 100 corresponding to the first display part 200, a light blocking member 35 may be further disposed to reduce or effectively prevent external light from being incident to the first and/or second display parts 200 and 300 and being emitted from the organic light emitting diode display.

In this way, by forming the light blocking member 35, although light emitted from the first display part 200 is not reflected by the first electrode 710b of the second display part 300 since such light is incident at a region of the substrate 100 where the first and/or second electrode 710b and 730b are not positioned, the light is absorbed by the light blocking member 35 and is not emitted to the outside of the organic light emitting diode display.

The light emitted from the second display part 300 passes through the second electrode 730b and is emitted through the first display part 200. However, the light emitted from the second display part 300 may be reflected by the first electrode 710b and may be emitted through the first display part 200.

In this way, one or more exemplary embodiment of the invention emits substantially all of the light generated by the first display part 200 and the second display part 300, such that the luminance of the display device may be increased. That is, where the light emitting element as a unit is disposed in plural within the organic light emitting diode display, a multi-photo effect may be achieved.

Also, in one or more exemplary embodiment of the organic light emitting diode display according to the invention, when forming the first display part 200 and the second display part 300, if the high luminance for the display is not required, only the first display part 200 may be driven or only the second display part 300 may be driven. That is, the first and second display parts 200 and 300 may be driven independently.

Figure 7:
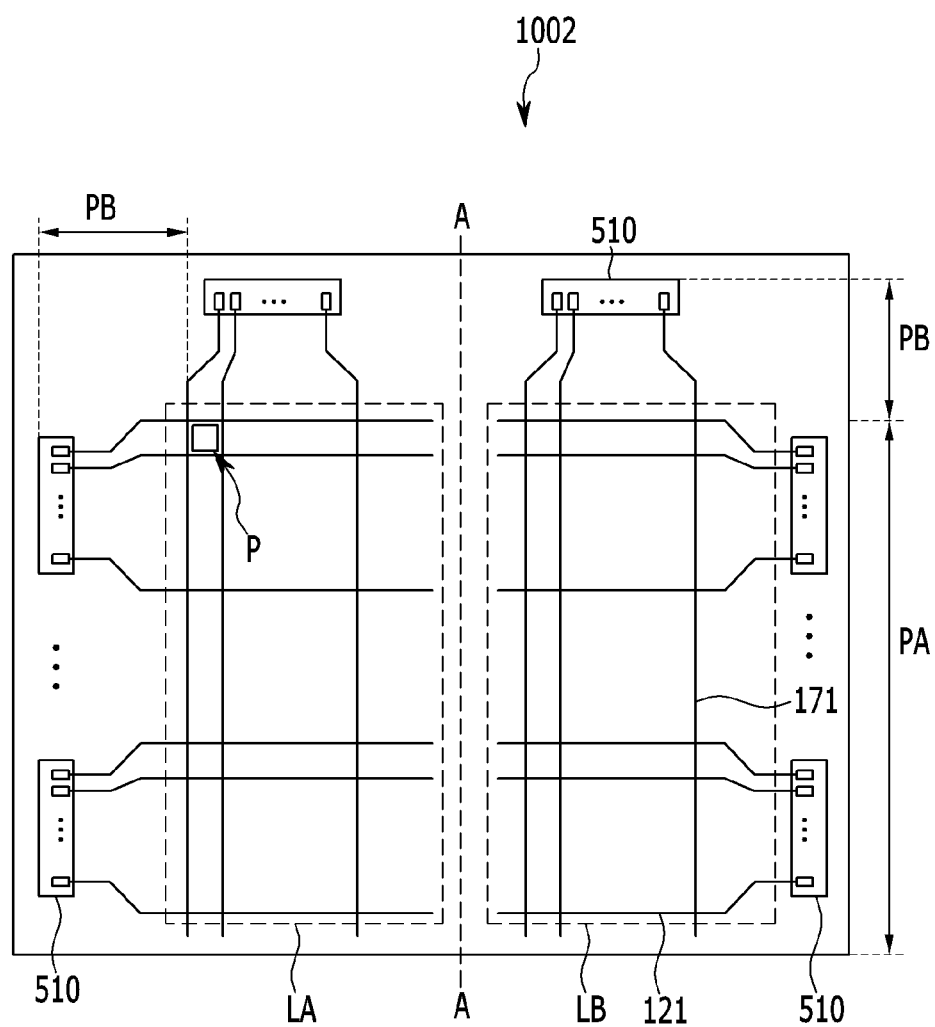
FIG. 7 is a plan view of still another exemplary embodiment of an organic light emitting diode display according to the invention.

FIG. 7 is a schematic plan view of still another exemplary embodiment of an organic light emitting diode display according to the invention.

The organic light emitting diode display of FIG. 7 is substantially the same as the organic light emitting diode display of FIG. 1 to FIG. 4 such that only differences will be described in detail.

The flexible display device 1002 shown in FIG. 7 includes the substrate 100 including the first display area LA and the second display area LB, and the first display part 200 and the second display part 300 respectively including a plurality of pixels P respectively in the first display area LA and the second display area LB.

The first and second signal lines 121 and 171 of the first display part 200 and the second display part 300 are electrically connected to the driver 510.

Differently from FIG. 3, the first signal line 121 is divided with reference to the bending region A such that the first signal line 121 is respectively at the first display part 200 and the second display part 300. That is, the first signal lines 121 are discontinuous since the bending region A of the substrate 100 excludes the first signal lines 121.

As shown in FIG. 3, when the first signal line 121 is continuous and extends from the first display area LA and into the second display area LB, a length of the first signal line 121 is relatively long such that a signal delay is generated. Accordingly, as shown in FIG. 7, when the first signal lines 121 are dividing into first first signal line portions 121 in the first display part 200 and second first signal line portions 121 the second display part 300, the signal delay may be reduced.

The first first signal line portions 121 of the first display part 200 and second first signal line portions 121 of the second display part, respectively receive the driving signal from a corresponding driver 510. Multiple first signal line portions 121 may receive the driving signal from a same driver 510, as illustrated in FIG. 7. While reference numeral 121 is used to indicate a continuous first signal line in FIG. 3, the reference numeral 121 may also be used to indicate a first signal line portion as shown in FIG. 7.

In the above exemplary embodiment described with reference to FIG. 3, a length in an extending direction of the first signal line 121 is larger than a length of the extending direction of the second signal line 171 such that the first signal line 171 intersects the bending region A. However, in an alternative exemplary embodiment, a length in an extending direction of the second signal line 172 may be larger than the length in the extending direction of the first signal line 171 such that the second signal line 172 may cross the bending region A. That is, different from FIG. 3 and FIG. 7, the first signal lines 121 may be elongated in the vertical direction while the second signal lines 171 are elongated in the horizontal direction.

Figure 8:
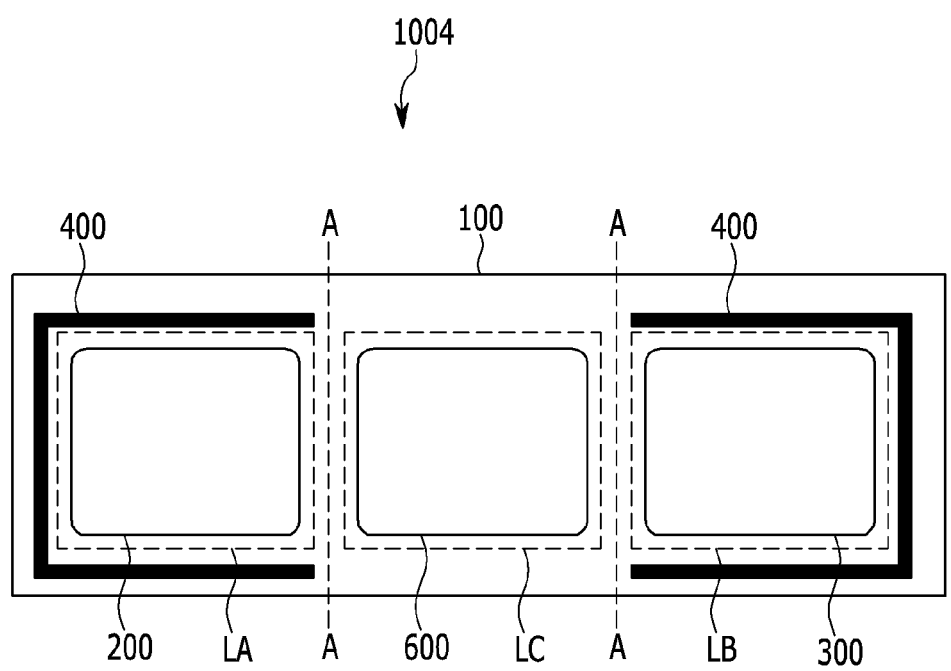
FIG. 8 is a schematic plan view of yet another exemplary embodiment of an organic light emitting diode display according to the invention.
Figure 9:
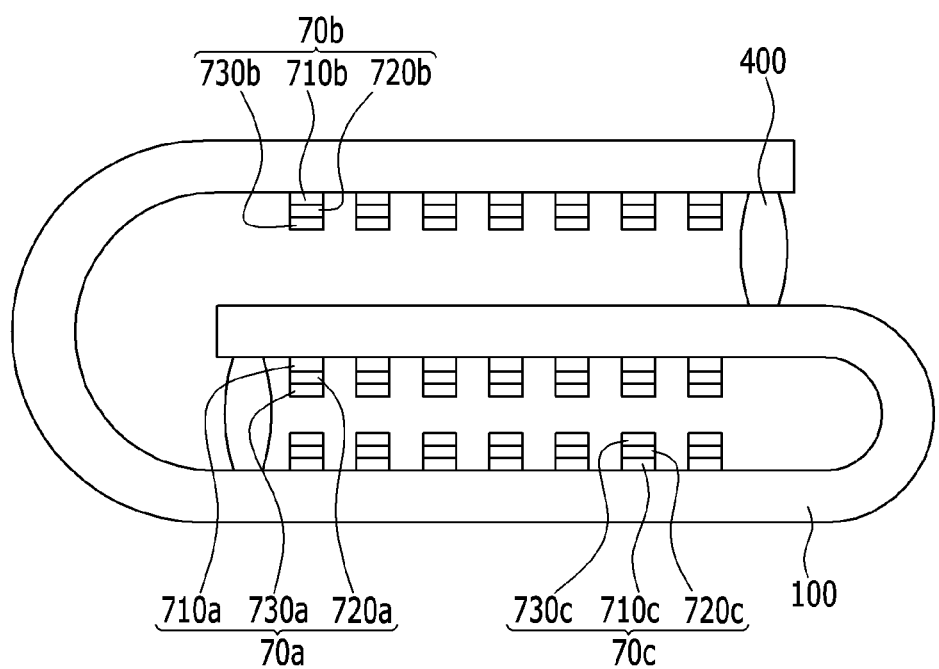
FIG. 9 and FIG. 10 are schematic cross-sectional views of exemplary embodiments of the organic light emitting diode display of FIG. 8, respectively.
Figure 10:
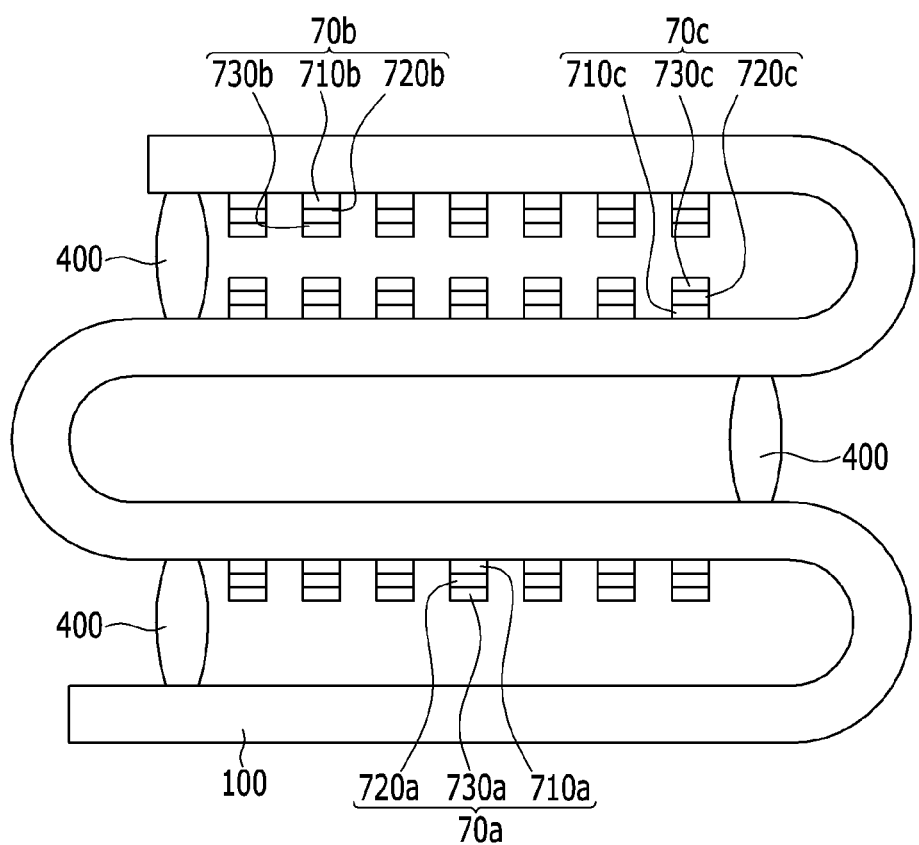

FIG. 8 is a schematic plan view of yet another exemplary embodiment of an organic light emitting diode display according to the invention, and FIG. 9 and FIG. 10 are respectively schematic cross-sectional views of the organic light emitting diode display of FIG. 8.

As shown in FIG. 8 to FIG. 10, the flexible display device 1004 includes a plurality of bending regions A such that the substrate 100 may be repeatedly bent, differently from the exemplary embodiment of FIG. 1 to 4.

That is, in FIG. 8 to FIG. 10, the organic light emitting diode display includes two bending regions A, and the first display part 200, the second display part 300 and a third display part 600. The first display part 200 to the third display part 600 are positioned at the same surface of the flexible substrate 100. The surface of the flexible substrate 100 upon which the display parts are disposed may be referred to as a first surface, while a surface of the flexible substrate 100 opposite to the first surface may be referred to as a second (or opposing) surface.

The first display part 200 to the third display part 600 respectively include the first light emitting element 70a, the second light emitting element 70b and a third light emitting element 70c, and the light emitting elements respectively include first electrodes 710a, 710b and 710c, organic emission layers 720a, 720b and 720c, and second electrodes 730a, 730b and 730c.

In the organic light emitting diode display of FIG. 9, the first electrode 710a and the second electrode 730a of the first light emitting element 70a, and the third light emitting element 70c, include the transparent layer or the semi-transparent layer, and the first electrode 710b and the second electrode 730b of the second light emitting element 70b respectively include the reflective layer and the transparent layer or the semi-transparent layer. This means that the first light emitting element 70a and the third light emitting element 70c positioned in a light emitting direction function as electrodes of the transparent layer.

In the above exemplary embodiment, the second display part 300 includes the first electrode 710b including the reflective layer, and the third light emitting element 70c includes the transparent layer or the semi-transparent layer. However, where the first electrode 710c of the third light emitting element 70c of the third display part 600 includes the reflective layer, and the first electrode 710a and 710b and the second electrode 730a and 730b of the second light emitting element 70b and the first light emitting element 70a include the transparent layer, the light is emitted in the opposite direction than when the first electrode 710b of the second light emitting element 70b includes the reflective layer. That is, if the first electrode 710b of the second light emitting element 70b includes the reflective layer, the light is emitted through the first display part 200 and the third display part 600, however, if the first electrode 710b of the third light emitting element 70c includes the transparent layer, the light is emitted through the first display part 200 and the second display part 300.

In the organic light emitting diode display of FIG. 9, the second electrode 730a of the first light emitting element 70a and the first electrode 710c of the third light emitting element 70c face each other, since the substrate 100 is bent to dispose the second, first and third display parts 300, 200 and 600, in sequential order, in a cross-sectional view. However, as shown in FIG. 10, the second electrode 730b of the second light emitting element 70b and the first electrode 710c of the third light emitting element 70c may face each other, since the substrate 100 is bent to dispose the second, third and first display part 300, 600 and 200 in sequential order, in the cross-sectional view.

As shown in FIG. 10, if the second electrode 730b of the second light emitting element 70b and the first electrode 710c of the third light emitting element 70c face each other, the first light emitting element 70a is exposed to the outside. Therefore, the substrate 100 is further bent at a bending region A to seal the first light emitting element 70a. The first light emitting element 70a may be sealed by the substrate 100 and the sealant 400, similar to how the second and third light emitting elements 70b and 70c are sealed.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
   a flexible substrate configured to be bent at least once at a bending region thereof;
   a first display part and a second display part respectively on first and second areas of a same surface of the flexible substrate, the bending region between the first and second areas of the same surface of the flexible substrate on which the first and second display parts are respectively disposed, the first display part and the second display part respectively comprising a plurality of first light emitting elements and a plurality of second light emitting elements;
   wherein
   the plurality of the first and second light emitting elements of the respective first and second display parts disposed on the first and second areas of the same surface of the flexible substrate is not disposed in the bending region between the first and second areas of the same surface of the flexible substrate on which the first and second display parts are disposed;
   each of a first light emitting element and a second light emitting element among the plurality of first and second light emitting elements comprises a first electrode, an emission layer and a second electrode disposed in order from the flexible substrate,
   the first electrode of the first light emitting element comprises a transparent layer or a semi-transparent layer,
   the first electrode of the second light emitting element comprises a reflective layer,
   the second electrode of the first light emitting element and the second light emitting element, comprises the transparent layer or the semi-transparent layer, and
   the flexible substrate bent at the bending region between the first and second areas of the same surface of the flexible substrate on which the first and second display parts are disposed and in which the plurality of the first and second light emitting elements of the respective first and second display parts is not disposed disposes the first and second areas of the same surface of the flexible substrate face each other to dispose the first and second display parts overlapping and facing each other.

2. The organic light emitting diode display of claim 1, wherein:
   the reflective layer comprises at least one material among magnesium, silver, gold, calcium, lithium, chromium, and aluminum, and alloys thereof; and
   the transparent layer comprises at least one material among indium tin oxide, indium zinc oxide, zinc oxide and indium oxide.

3. The organic light emitting diode display of claim 1, further comprising:
   a sealant on first and second seal areas of the same surface of the flexible substrate on which the first display part and the second display part are disposed, at an edge of the first display part,
   wherein in the bent state of the organic light emitting diode display, the first and second seal areas of the same surface of the flexible substrate face each other to seal the first display part and the second display part between the sealant and the same surface of the flexible substrate.

4. The organic light emitting diode display of claim 1, wherein
   the emission layer emits white light.

5. The organic light emitting diode display of claim 1, further comprising:
a third display part on the flexible substrate, between the first display part and the second display part in an unbent state of the organic light emitting diode display, and comprising a plurality of third light emitting elements.

6. The organic light emitting diode display of claim 5, wherein
a third light emitting element among the plurality of third light emitting elements is on a same surface of the flexible substrate as the first light emitting element and the second light emitting element.

7. The organic light emitting diode display of claim 6, wherein
the third light emitting element comprises the first electrode, the emission layer, and the second electrode, and
the first electrode and the second electrode of the third light emitting element comprise the transparent layer or the semi-transparent layer.

8. The organic light emitting diode display of claim 7, wherein the emission layer emits white light.

9. The organic light emitting diode display of claim 7, wherein
the reflective layer comprises at least one material among magnesium, silver, gold, calcium, lithium, chromium and aluminum, and alloys thereof, and
the transparent layer comprises one of a material among indium tin oxide, indium zinc oxide, zinc oxide and indium oxide.

10. The organic light emitting diode display of claim 1, wherein
the flexible substrate comprises at least one of polyimide, polycarbonate, polyacrylate, polyetherimide, polyethersulfone, polyethylene terephthalate and polyethylene naphthalate.

11. The organic light emitting diode display of claim 1, further comprising:
a light blocking member on the substrate,
wherein the flexible substrate bent at the bending region between the first and second areas of the same surface of the flexible substrate on which the first and second display parts are disposed and in which the plurality of the first and second light emitting elements of the respective first and second display parts is not disposed disposes:
the light blocking member overlapping a region of the substrate at which the first and second display parts are not disposed, and
the second display part comprising the second light emitting element for which the first electrode thereof comprises the reflective layer between the light blocking member and the first display part.

12. A method of forming an organic light emitting diode display, comprising:
providing a flexible substrate configured to be bent at least once at a first bending region thereof;
disposing a first display part and a second display part respectively on first and second areas of a same surface of the flexible substrate, the first bending region between the first and second areas of the same surface of the flexible substrate on which the first and second display parts are respectively disposed;
bending the flexible substrate with the first and second display parts thereon, at thea first bending region of the flexible substrate; and
emitting light to outside the organic light emitting diode display, through the first display part,
wherein
the first and second display parts comprise a plurality of first light emitting elements and a plurality of second light emitting elements, respectively, the plurality of the first and second light emitting elements of the respective first and second display parts disposed on the first and second areas of the same surface of the flexible substrate is not disposed in the first bending region between the first and second areas of the same surface of the flexible substrate on which the first and second display parts are disposed;
each of a first light emitting element and a second light emitting element among the plurality of first and second light emitting elements, comprises a first electrode, an emission layer and a second electrode disposed in order from the flexible substrate,
the first electrode of the first light emitting element comprises a transparent layer or a semi-transparent layer,
the first electrode of the second light emitting element comprises a reflective layer,
the second electrode of the first light emitting element and the second light emitting element, comprises the transparent layer or the semi-transparent layer,
the bending the flexible substrate at the first bending region between the first and second areas of the same surface of the flexible substrate on which the first and second display parts are disposed and in which the plurality of the first and second light emitting elements of the respective first and second display parts is not disposed disposes the first and second areas of the same surface of the flexible substrate to face each other to dispose the first and second display parts overlapping and facing each other in a bent state of the organic light emitting diode display.

13. The method of claim 12, further comprising:
disposing a sealing member on first and second seal areas of the same surface of the flexible substrate on which the first display part and the second display part are disposed,
wherein in the bent state of the organic light emitting diode display, the first and second seal areas of the same surface of the flexible substrate face each other to seal the plurality of first light emitting elements and the plurality of second light emitting elements between the sealing member and the same surface of the flexible substrate.

14. The method of claim 12, further comprising disposing a third display part on the same surface of the flexible substrate,
wherein the third display part is between the first and second display parts in an unbent state of the organic light emitting diode display.

15. The method of claim 14, further comprising bending the flexible substrate with the first, second and third display parts thereon, at the first bending region and a second bending region of the substrate, to dispose the first, second and third display parts overlapping and facing each other, respectively.

* * * * *